(12) United States Patent
Corsi

(10) Patent No.: US 7,557,651 B2
(45) Date of Patent: Jul. 7, 2009

(54) DUAL TRANSCONDUCTANCE AMPLIFIERS AND DIFFERENTIAL AMPLIFIERS IMPLEMENTED USING SUCH DUAL TRANSCONDUCTANCE AMPLIFIERS

(75) Inventor: Marco Corsi, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 27 days.

(21) Appl. No.: 11/670,564

(22) Filed: Feb. 2, 2007

(65) Prior Publication Data

US 2008/0186091 A1   Aug. 7, 2008

(51) Int. Cl.
*H03F 3/45* (2006.01)

(52) U.S. Cl. .................. 330/69; 330/124 R; 330/258; 330/84

(58) Field of Classification Search .............. 330/69, 330/124 R, 258, 75, 84
See application file for complete search history.

(56) References Cited

U.S. PATENT DOCUMENTS

| 3,629,719 | A | * | 12/1971 | Heller et al. ............. 330/69 |
|---|---|---|---|---|
| 5,293,136 | A | | 3/1994 | Ryat |
| 5,418,494 | A | * | 5/1995 | Betti et al. ............... 330/254 |
| 5,701,099 | A | * | 12/1997 | Shafir ..................... 327/552 |
| 5,729,178 | A | * | 3/1998 | Park et al. ............... 330/258 |
| 5,990,737 | A | | 11/1999 | Czarnal et al. |
| 6,411,240 | B1 | * | 6/2002 | Greitschus .............. 341/155 |
| 6,621,337 | B2 | * | 9/2003 | Gropl ..................... 330/69 |
| 6,833,756 | B2 | | 12/2004 | Ranganathan |
| 7,274,253 | B2 | * | 9/2007 | Pan ........................ 330/51 |

* cited by examiner

*Primary Examiner*—Patricia Nguyen
(74) *Attorney, Agent, or Firm*—John J. Patti; Wade J. Brady, III; Frederick J. Telecky, Jr.

(57) ABSTRACT

Various systems and methods for signal amplification are disclosed. For example, some embodiments of the present invention provide differential amplifiers that include dual transconductance characteristics. Such amplifiers include two dual input operational amplifiers that each include two input sets. A first of the input sets exhibits a first transconductance and a second of the input sets exhibits a second transconductance. The two dual input operational amplifiers are configured such that to a common mode signal, the amplifier exhibits an overall transconductance that is the difference between the first transconductance and the second transconductance. In contrast, to a differential signal, the overall transconductance is the sum of the first transconductance and the second transconductance.

24 Claims, 4 Drawing Sheets

DUAL TRANSCONDUCTANCE AMPLIFIERS AND DIFFERENTIAL AMPLIFIERS IMPLEMENTED USING SUCH DUAL TRANSCONDUCTANCE AMPLIFIERS

BACKGROUND OF THE INVENTION

The present invention is related to electrical signal amplification, and more particularly to novel compensation schemes for an amplifier.

Operational amplifiers are staple building blocks in many analog and mixed signal systems. In general, an operational amplifier 100 is represented using the schematic symbol of FIG. 1a including an inverting input 102, a non-inverting input 104, and an output 106. Operational amplifier 100 functions such that the voltage at output 106 is the difference between the voltage at inverting input 102 and non-inverting input 104 multiplied by the open loop again of operational amplifier 100 (e.g., $V_{output\ 106} = A\ [V_{input\ 104} - V_{input\ 102}]$). The open loop gain (A) for operational amplifier 100 is typically large (e.g., much larger than one thousand) and in ideal calculations is treated as infinite. One or more resistors may be used in relation to operational amplifier 100 to produce amplifiers with precisely controlled gain through the use of negative feedback.

For example, as shown in FIG. 1b, a unity gain configuration 101 using an operational amplifier is shown. In particular, output 106 is electrically connected to inverting input 102. In this configuration when the open loop gain (A) is very large, output 106 will closely follow non-inverting input 104 (i.e., a unity gain). In contrast, if a resistor network is added, such as a resistor 108 and a resistor 110 in configuration 103 of FIG. 1c, the voltage at output 106 is attenuated before being fed back to inverting input 102. This attenuation results in a gain greater than unity. In this particular case, the voltage at inverting input 102 is described by the following equation:

$$V_{input\ 102} = V_{output\ 106}(R_{108}/(R_{108}+R_{110})).$$

The gain ($V_{out}/V_{in}$) of configuration 103 can be shown as the following equation:

$$\text{Gain} = R_{108}/(R_{108}+R_{110}).$$

While these principles of feedback in operational amplifiers hold true, they do not guarantee stable operation of the amplifier. In particular, the real amplifier elements introduce time delays into the feedback loop. To ensure stability, the aforementioned time delays must be accounted for. Parasitic poles and zeros in the real transfer response of the amplifier cause the output signal to be shifted in time with respect to the input signal. At some frequency, the time shift causes the intended negative feedback to appear as positive feedback which results in circuit oscillation.

FIG. 1d shows a simplified model 150 of the operational amplifiers depicted in FIGS. 1a-1c including an input stage 160 with a certain transconductance (Gm) coupled into a capacitor 170, a resistor 180 and a unity gain output stage 185 with at least one parasitic pole (the parasitic pole are represented by the resistor and capacitor 190). A parasitic pole is a time delay element practical circuits have many of these. The unity gain frequency of an amplifier corresponding to model 150 is described by the following equation:

$$\text{Gm}/2\pi C\ \text{Hz}$$

Assuming the pole of the unity gain output stage 185 occurs at a higher frequency than any other parasitic or otherwise non-intended poles and or zeroes in the amplifier by an appreciable margin, then the amplifier corresponding to model 150 will be expected to provide stable operation at unity gain.

For operational amplifiers the attenuation achieved by the feedback network has the effect of stabilizing the amplifier. Larger closed loop gain settings mean larger attenuations in the feedback and better stability. As an example using the previously discussed FIG. 1c, resistor 108 and resistor 110 attenuate the voltage at output 106 that is fed back to inverting input 102. All other things being equal, where a given amplifier is stable for a certain compensation capacitance (C) for a unity gain configuration, the capacitance can be reduced by the attenuation of the feedback network (i.e., resistor 108 and resistor 110) for any given value of attenuation. What this essentially means is that an amplifier's compensation can be optimized for a minimum stable closed loop gain. If the amplifier is operated below the minimum stable gain the amplifier will oscillate. To prevent the aforementioned oscillation, the transconductance (Gm) may be reduced and/or the capacitance may be increased. Either of the aforementioned changes cause a slow down in the amplifier's response to changing input signals.

Thus, if operational amplifiers are to be used in closed loop gain configurations with a desired gain, capacitance (C) and transconductance (Gm) can be optimized to achieve the fastest possible response while maintaining stable operation at the desired gain. If the feedback attenuation of the amplifier is then adjusted such that the closed loop gain is less than the designed minimum stable gain (assuming the desired gain is greater than or equal to unity gain), the amplifier will become unstable and will oscillate. To re-establish the stability for the amplifier, either or both the transconductance (Gm) may be reduced or the capacitance may be increased. As previously discussed, this provides for stable operation of the amplifier at the cost of reducing the bandwidth of the amplifier circuit.

In a possible scenario, the aforementioned potential for instability is compensated by creating a low frequency pole that limits bandwidth so severely that any problematic higher frequency poles are no longer dominant. Such an approach, however, limits circuit functionality. Alternatively, external compensation, slew rate limiting and/or AC feedforward approaches may be utilized to address the potential for oscillation. However, each of the aforementioned approaches is limited in its effectiveness.

Operational amplifiers can be used in a variety of different configurations to produce desired circuit functions. One such circuit is a differential amplifier 300 as shown in FIG. 2. Differential amplifier 300 uses two operational amplifiers 301, 302 and three resistors 320, 330, 340. Differential amplifier 300 has a differential voltage output (Voutdiff) that is the difference between a positive output 305 and a negative output 306. Differential amplifier 300 has a differential voltage input (Vindiff) that is the difference between a positive input 303 and a negative input 304. The common mode at the input (Vincm) is the average voltage of positive input 303 and negative input 304 (i.e., $[V_{303}+V_{304}]/2$) and the common mode output voltage (Voutcm) is the average voltage of positive output 305 and negative output 306 (i.e., $[V_{305}+V_{306}]/2$). The differential gain of differential amplifier 300 is given by the following equation:

$$\text{Differential Gain} = V\text{outdiff}/V\text{indiff} = (2Rf+Ra)/Ra;$$

And the common mode gain of this differential amplifier is given by the following equation:

$$\text{Common Mode Gain} = V\text{outcm}/V\text{incm} = 1.$$

Differential amplifier 300 has a problem with stability as the closed loop gain for differential amplifier 300 is unity for common mode signals. To achieve stable operation, operational amplifier 301 and operational amplifier 302 must be configured to have a combination of transconductance (Gm) and capacitance (C) (i.e., the transconductance (Gm) and capacitance (C) shown in FIG. 1d) consistent with unity gain stability as previously discussed. This combination of transconductance and capacitance substantially slows the operation of differential amplifier 300.

Thus, for at least the aforementioned reasons, there exists a need in the art for advanced systems and methods for amplifying electrical signals.

BRIEF SUMMARY OF THE INVENTION

The present invention is related to electrical signal amplification, and more particularly to novel compensation schemes for an amplifier.

Some embodiments of the present invention provide differential amplifiers that include dual transconductance characteristics. Such amplifiers include two dual input operational amplifiers that each include two input sets. A first of the input sets exhibits a first transconductance and a second of the input sets exhibits a second transconductance. The two dual input operational amplifiers are configured such that to a common mode signal, the amplifier exhibits an overall transconductance that is the difference between the first transconductance and the second transconductance. In contrast, to a differential signal, the overall transconductance is the sum of the first transconductance and the second transconductance.

Each of the dual input operational amplifiers includes two input sets that are each comprised of a non-inverting input and an inverting input. Thus, a differential operational amplifier using two dual input operational amplifier includes four input sets each including a pair of a non-inverting inputs and a pair of inverting inputs. For ease of discussion, one of the dual input operational amplifiers is described as having a first input set and a second input set, and the other dual input operational amplifier is described as having a third input set and a fourth input set. The first input set is amplified by a first transconductance to form a first amplified signal, the second input set is amplified by a second transconductance to form a second amplified signal, the third input set is amplified by the first transconductance to form a third amplified signal, and the fourth input set is amplified by the second transconductance to form a fourth amplified signal. The first dual input operational amplifier includes a summation node that aggregates the first amplified signal with the second amplified signal to create a first aggregate amplified signal; and the second dual input operational amplifier includes another summation node that aggregates the third amplified signal with the fourth amplified signal to create a second aggregate amplified signal.

The differential amplifier further includes a positive differential input that is electrically coupled to the non-inverting input of the first input set and to the inverting input of the fourth input set. As used herein, the phrase "electrically coupled" is used in its broadest sense to mean any coupling whereby an electrical signal may be passed from one node to another. Thus, for example, two nodes may be electrically coupled by an electrically conductive wire extending from one of the nodes to the other. Alternatively, two nodes may be electrically coupled by a resistor or capacitor that is connected between the nodes. Based on the disclosure provided herein, one of ordinary skill in the art will recognize a variety of ways in which two nodes may be electrically coupled one to another. The differential amplifier further includes a negative differential input that is electrically coupled to the inverting input of the second input set and to the non-inverting input of the third input set. A first feedback resistor electrically couples an output of the first dual input operational amplifier to the inverting input of the first input set and to the non-inverting input of the fourth input set. A second feedback resistor electrically couples an output of the second dual input operational amplifier to the non-inverting input of the second input set via the second feedback resistor and to the inverting input of the third input set via the second feedback resistor.

In various instances of the aforementioned embodiments, the dual transconductance characteristics may be different between the two dual input operational amplifiers. In other instances, the dual transconductance characteristics may be the same between the two dual input operational amplifiers. Further, in some cases, the two transconductance characteristics of an individual dual input operational amplifier may be the same, while in other cases they may be different.

In some instances of the aforementioned embodiments, another feedback resistor electrically couples the two feedback resistors identified above. Further, in various instances of the aforementioned embodiments, each of the dual input operational amplifiers includes an output stage that is operable to drive an output that is the respective aggregate amplified signal. In some instances of the aforementioned embodiments, one or both of the dual input operational amplifiers is configured such that the first aggregate amplified signal is proportionately equal to the common mode input signal amplified by the difference between the first transconductance and the second transconductance. In various instances of the aforementioned embodiments, each of the input sets includes a positive differential input signal applied to the base of a first NPN transistor, a negative differential input signal applied to the base of a second NPN transistor, and a bias circuit. The emitter of the first NPN transistor and the emitter of the second NPN transistor are electrically coupled to the bias circuit, and the bias circuit at least in part defines the transconductance associated with the respective input set.

Other embodiments of the present invention provide dual input operational amplifiers. Such dual input operational amplifiers include a first input set, a second input set and a summation node. The first input set is amplified by a first transconductance to form a first amplified signal, and the second input set is amplified by a second transconductance to form a second amplified signal. The summation node aggregates the first amplified signal with the second amplified signal to create an aggregate amplified signal. In some instances of the aforementioned embodiments, each of the first input set and the second input set includes a non-inverting input and an inverting input. In various instances of the aforementioned embodiments, the dual input operational amplifier further includes an output stage that drives the aggregate amplified signal as an output. In some cases of the aforementioned embodiments, the dual input operational amplifier is configured such that the aggregate amplified signal is proportionately equal to the common mode input signal amplified by the difference between the first transconductance and the second transconductance. In such cases, the dual input operational amplifier may also be configured such that the aggregate amplified signal is proportionately equal to the common mode input signal amplified by the sum of the first transconductance and the second transconductance.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to electrical signal amplification, and more particularly to novel compensation schemes for an amplifier.

Figure 3:
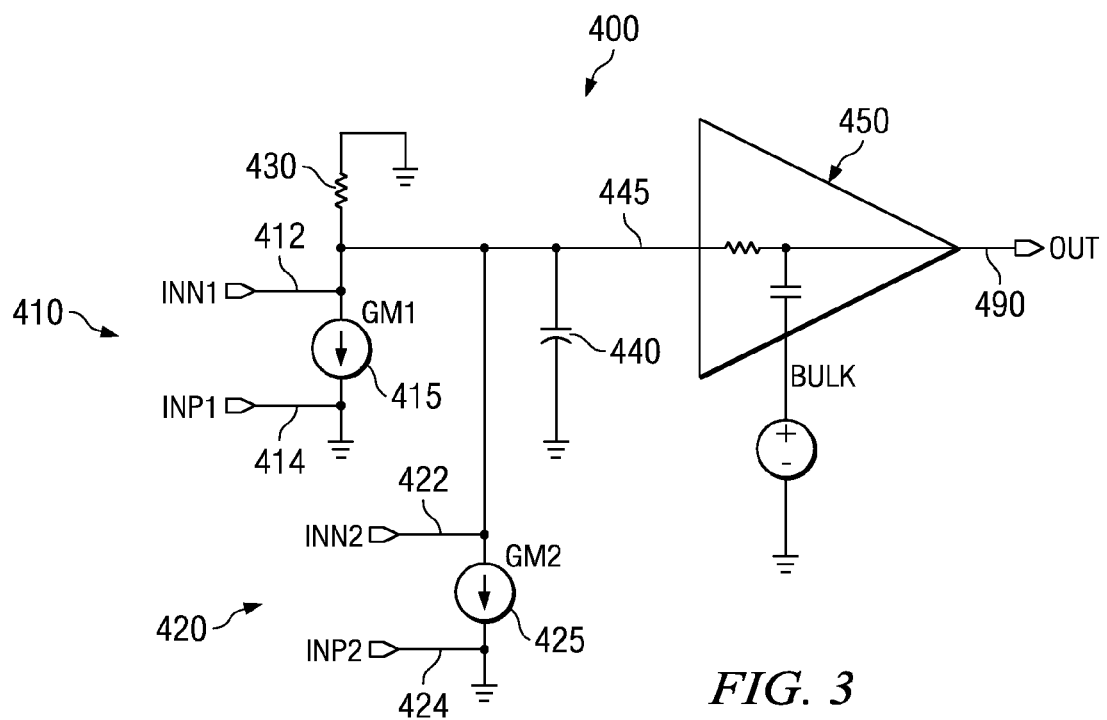
FIG. 3 shows an operational amplifier including two input sets with each of the input sets exhibiting a distinct transconductance (Gm) in accordance with one or more embodiments of the present invention.

Turning to FIG. 3, a model of an operational amplifier 400 including two input sets (input set 410 and input set 420) in accordance with one or more embodiments of the present invention is shown. Input set 410 includes a non-inverting input 414 and an inverting input 412 that feed an input stage 415. Input stage 415 exhibits a transconductance, Gm1. As used herein, the term "transconductance" is used in its broadest sense to mean the product of any circuit that provides an output current in proportion to an input voltage. Based on the disclosure provided herein, one of ordinary skill in the art will recognize a variety of circuits and/or approaches that may be used to produce a desired transconductance. The proportion of output current to input voltage is often expressed as mA/V, but may be expressed using other units. Similarly, input set 420 includes a non-inverting input 424 and an inverting input 422 that feed an input stage 425. Input stage 425 exhibits a transconductance, Gm2. The sum of Gm1 and Gm2 yields the overall transconductance of operational amplifier 400. In some embodiments of the present invention, Gm1 is equivalent to Gm2, while in other embodiments of the present invention Gm1 is different from Gm2. In some cases, as more fully described below, a difference between Gm1 and Gm2 provides the basis for stable operation for both common mode and differential signals.

Input stage 415 and input stage 425 are electrically coupled between ground and an input node 445. Input node 445 is electrically coupled to a resistor 430, a capacitor 440, and an output stage 450. Following the model of FIG. 3, the combination of the current pulled by both input stage 415 and input stage 425 establishes the voltage at node 445, and thus the voltage at an output 490. Thus, when input set 410 is in phase with input set 420, the value of output 490 is defined by the following equation:

$$\text{Voltage}_{490} = [(\text{Input}_{414} - \text{Input}_{412})Gm1 + (\text{Input}_{424} - \text{Input}_{422})Gm2]R_{430}.$$

Where, for example, the voltage difference applied to the two input sets 410, 420 is the same, the voltage at output 490 is given by the following equation:

$$\text{Voltage}_{490} = [(\text{Input}_{414} - \text{Input}_{412})(Gm1 + Gm2)]R_{430}.$$

Figure 4:
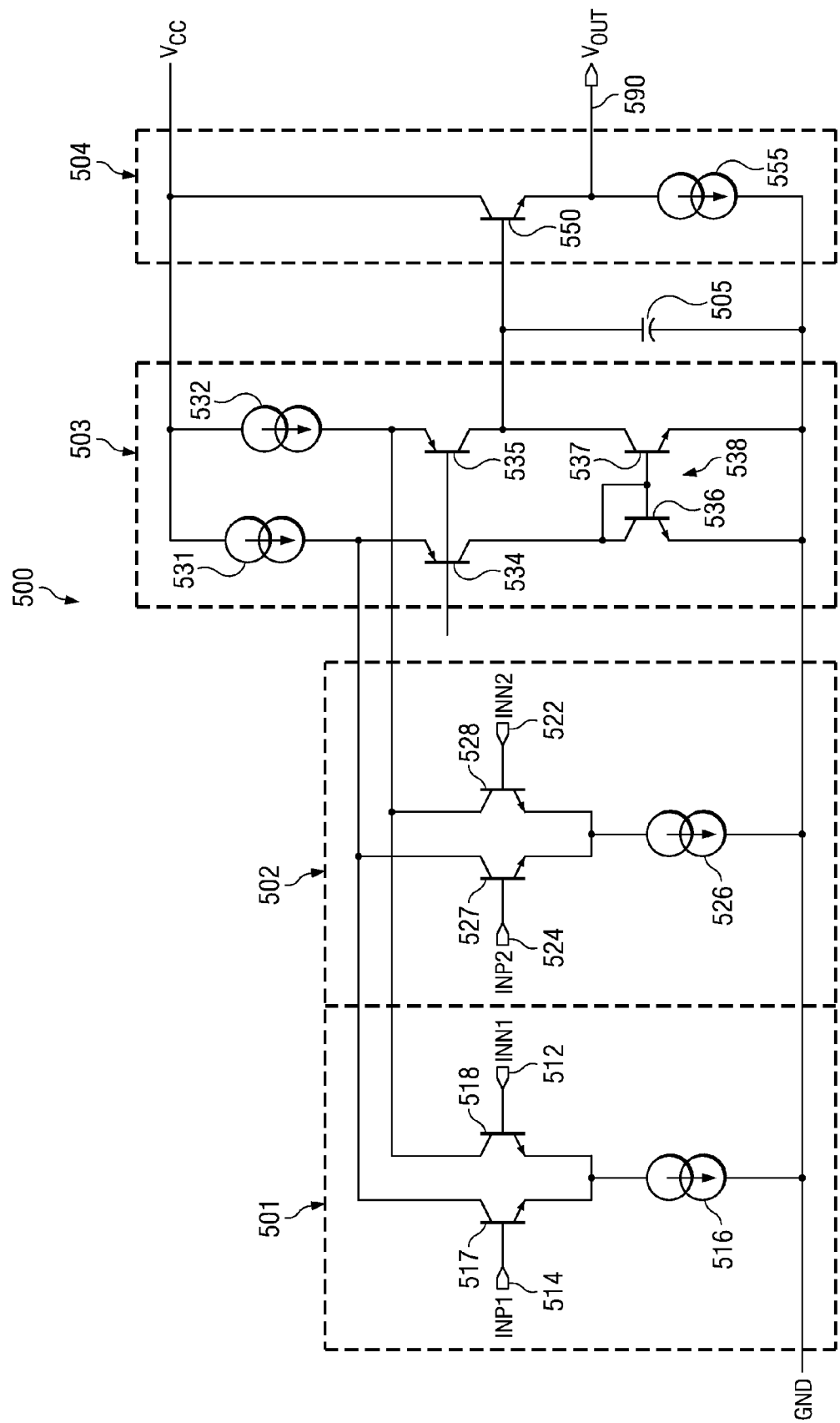
FIG. 4 is an exemplary schematic diagram of one implementation of the operational amplifier of FIG. 3.

Turning to FIG. 4, an exemplary schematic diagram depicts one implementation of an operational amplifier 500 represented by the model of FIG. 3. As shown, operational amplifier 500 includes an NPN differential pair 501 and an NPN differential pair 502. NPN differential pair 501 includes a transistor 517 with its base electrically coupled to a positive input 514, and a transistor 518 with its base electrically coupled to a negative input 512. NPN differential pair 502 includes a transistor 527 with its base electrically coupled to a positive input 524, and a transistor 528 with its base electrically coupled to a negative input 522. NPN differential pair 501 is electrically coupled to a bias circuit 516, and NPN differential pair is electrically coupled to a bias circuit 526. Bias circuit 516 sets a transconductance (Gm1) of differential input pair 501, and bias circuit 526 sets a transconductance (Gm2) of differential input pair 502. The two different transconductance values (Gm1 and Gm2) are defined relative to one another as the ratio of current sourced by bias circuit 516 and the current sourced by bias circuit 526.

Operational amplifier 500 further includes a summing circuit 503. The bases of transistor 534 and transistor 535 are tied to a potential positive of ground and negative of Vcc consisted with correct circuit operation. Summing circuit 503 includes a bias circuit 531 and a bias circuit 532. Bias circuit 531 is electrically coupled to the collector of transistor 517 of NPN differential pair 501 and to the collector of transistor 527 of NPN differential pair 502. In addition, bias circuit 531 is electrically coupled to the emitter of a transistor 534 of summing circuit 503. Bias circuit 532 is electrically coupled to the collector of transistor 518 of NPN differential pair 501 and to the collector of transistor 528 of NPN differential pair 502. In addition, bias circuit 532 is electrically coupled to the emitter of a transistor 535 of summing circuit 503. The collectors of transistors 534, 535 are electrically coupled to a current mirror 538 comprising a transistor 536 and a transistor 537. Operational amplifier 500 also includes an output stage 504 including a transistor 550 and a bias circuit 555. The collector of transistor 535 is electrically coupled to the base of transistor 550, and to ground via a compensation capacitor 505. The emitter of transistor 550 is electrically coupled to ground via bias circuit 555.

The transconductance (Gm1) of NPN differential pair 501 and the transconductance (Gm2) of NPN differential pair 502 are described by the following equations:

$$Gm1 = q*I_{516}/k*T; \text{ and}$$

$$Gm1 = q*I_{526}/k*T.$$

In the aforementioned equations, q is the charge on an electron, k is Boltzmann's constant and T is the temperature in Kelvin. $I_{516}$ is the current sourced by bias circuit 516 and $I_{526}$ is the current sourced by bias circuit 526. The two transconductance values (Gm1 and Gm2) are applied to summation circuit 503 where they are summed, and the current output reflecting the sum of the two transconductance values is applied to output stage 504 and compensation capacitor 505.

It should be noted that the schematic of amplifier 500 is a simple implementation of a dual transconductance amplifier in accordance with one or more embodiments of the present invention. Based on the disclosure provided herein, one of ordinary skill in the art will recognize a variety of implementations of a dual transconductance amplifier that may be used in accordance with various embodiments of the present invention.

Figure 5:
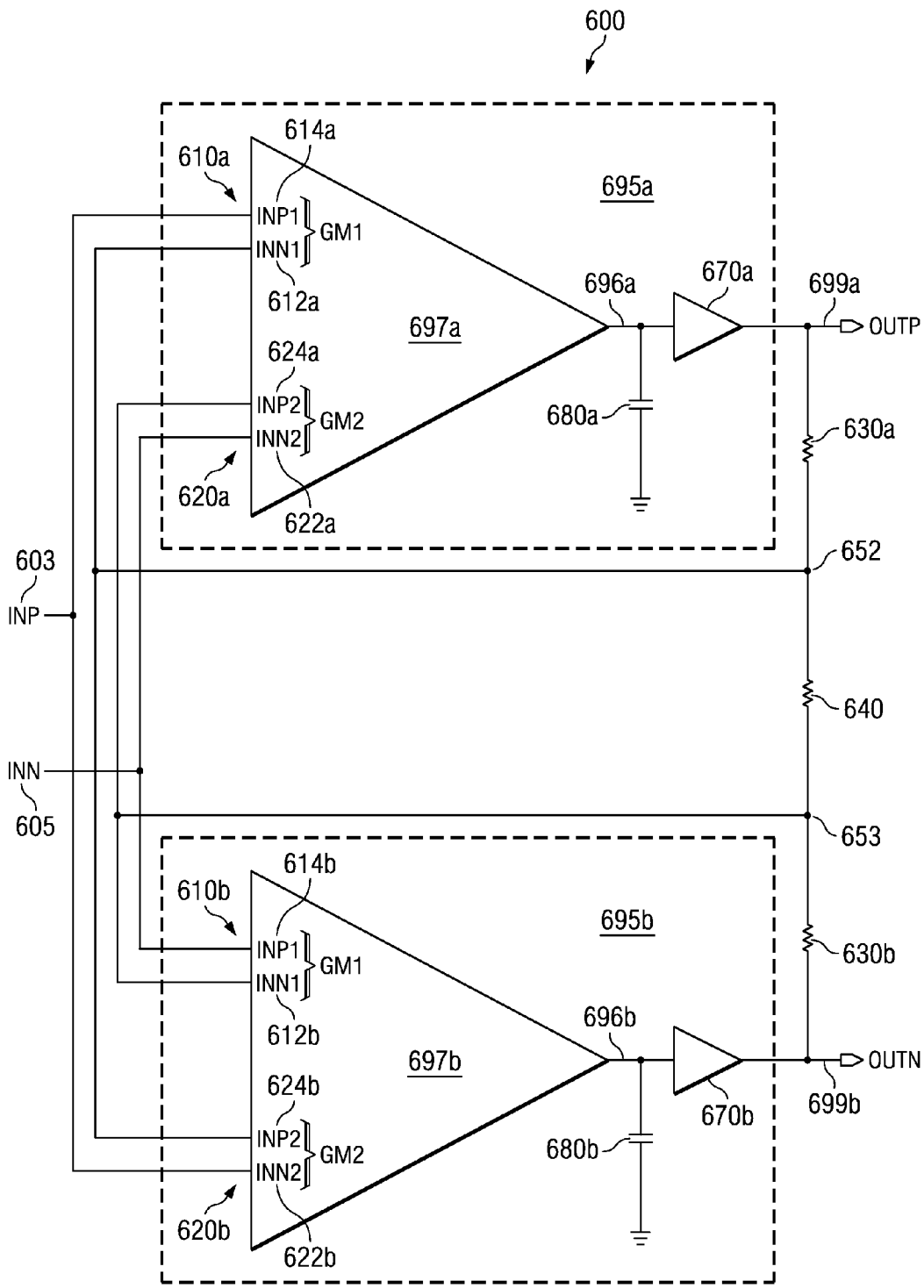
FIG. 5 depicts a differential amplifier utilizing two operational amplifiers that each include two input sets with each of the input sets exhibiting a distinct transconductance (Gm) in accordance with various embodiments of the present invention.

Turning to FIG. 5, a differential amplifier 600 utilizing two operational amplifiers 695 that each include two input sets 610, 620 with each of the input sets exhibiting a distinct transconductance in accordance with various embodiments of the present invention is depicted. Each of operational amplifiers 695 include a transconductance stage 697, a capacitor 680, and an output stage 670. An output 696 of transconductance stage 697 is electrically coupled to the input of output stage 670 and capacitor 680. The other plate of capacitor 680 is electrically coupled to ground. Input set 610 includes a non-inverting input 614 and an inverting input 612, and input set 620 includes a non-inverting input 624 and an inverting input 622. The transconductance of input set 610 is Gm1, and the transconductance of input set 620 is Gm2. Each of operational amplifiers 695 may be implemented in accordance with the schematic of amplifier 500 above, or using any other approach where the amplifier includes two input sets each associated with a respective transconductance as discussed above in relation to the model of FIG. 3. Based on the disclosure provided herein, one of ordinary skill in the art will recognize a variety of circuits and/or approaches that may be used to produce a desired transconductance. Each of operational amplifiers 695 provide an output 699 that is driven by a respective one of output stages 670.

Output 699a is electrically coupled to a positive output node (OUTP) of differential amplifier 600, and to a first feedback node 652 via a feedback resistor 630a, Similarly, output 699b is electrically coupled to a negative output node (OUTN) of differential amplifier 600, and to a second feedback node 653 via a feedback resistor 630b, First feedback node 652 is also electrically coupled to second feedback node 653 via a resistor 640, and to inverting input 612a of operational amplifier 695a and to non-inverting input 624b of operational amplified 695b. Second feedback node 653 is also electrically coupled to non-inverting input 624a of operational amplifier 695a and to inverting input 612b of operational amplifier 695b, A differential input signal including a positive input (INP) 603 and a negative input (INN) 605 drives differential amplifier 600. In particular, positive input 603 is electrically coupled to non-inverting input 614a of operational amplifier 695a, and to inverting input 622b of operational amplifier 695b. Negative input 605 is electrically coupled to non-inverting input 614b of operational amplifier 695b, and to inverting input 622a of operational amplifier 695a.

Figure 1A:
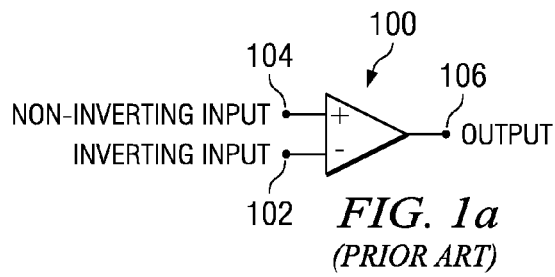
FIGS. 1a-1d show different known operational amplifier configurations.
Figure 1B:
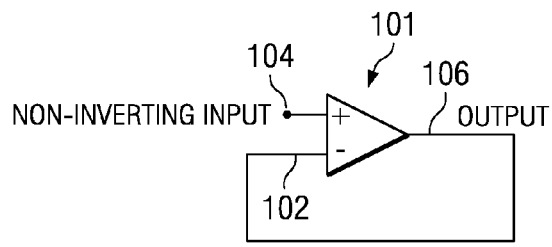
Figure 1C:
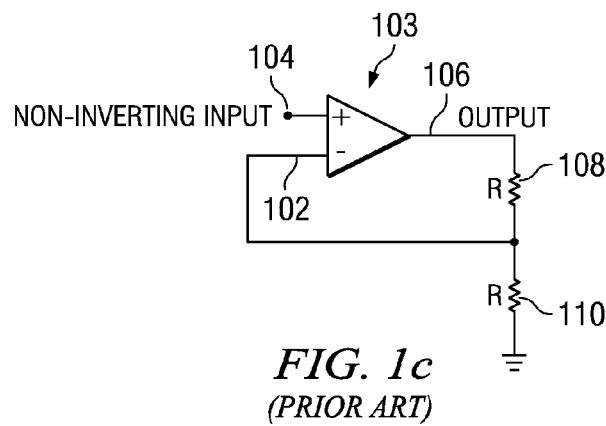
Figure 1D:
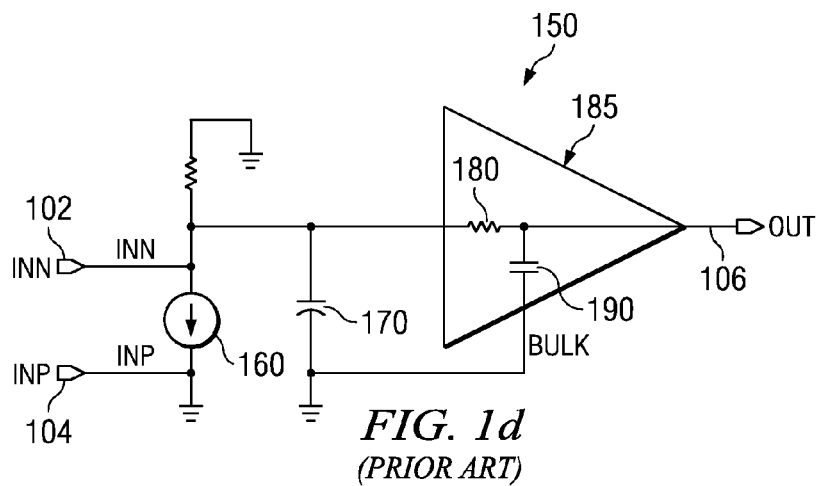
Figure 2:
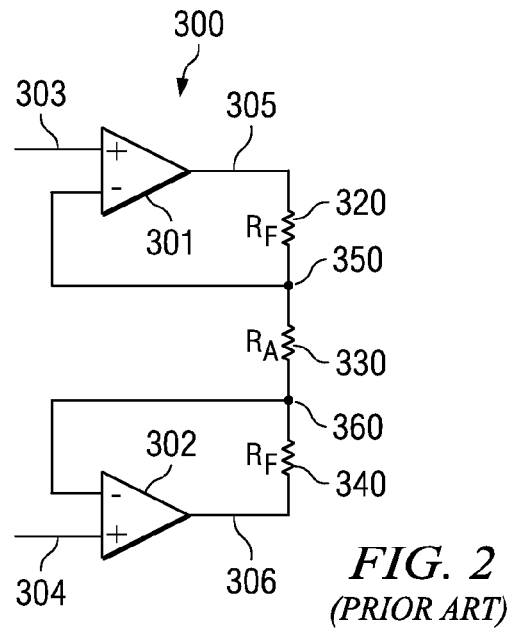
FIG. 2 shows a prior art differential amplifier that is typically unstable for common mode signals at unity gain.

In this case, each of operational amplifiers 695 of differential amplifier 600 may consume the same power and exhibit the same overall Gm (i.e., Gm=Gm1+Gm2) as the operational amplifiers discussed above in relation to differential amplifier 300 of FIG. 2. As would be expected then, where Gm1 is the same as Gm (i.e., Gm2=0), the same instability problems evident in differential amplifier 300 would also be evident in differential amplifier 600. However, differential amplifier 600 may be implemented such that the transconductance (combination of Gm1 and Gm2) is different for a common mode signal as opposed to a differential signal. In particular, in some embodiments of the present invention, differential amplifier 600 may be implemented such that the transconductance for a differential signal is (Gm1+Gm2). In contrast, the transconductance for common mode signals (Gm1−Gm2), where Gm1 is greater than Gm2. Thus, for a differential signal a relatively large Gm is applied to the signal amplification, whereas with a common mode signal the amplification a smaller total Gm is available. In this way, a stable common mode response can be achieved, while at the same time providing a high bandwidth differential signal response. Further, the aforementioned response is achieved without a substantial noise or power penalty.

Where both operational amplifiers 695 are assumed to be essentially identical, input 603 and input 605 can be considered electrically coupled for the purpose of common mode analysis. Thus, for the common mode case of operational amplifier 695a, the signal seen at non-inverting input 614a is identical but opposite in phase to the signal seen at inverting input 624a. Therefore, the resulting overall transconductance for differential amplifier 600 is Gm1−Gm2 for a common mode signal. This is the total transconductance used to determine the stability of differential amplifier 600 when presented with a common mode signal. The same analysis applies for signals presented at the inputs of operational amplifier 695b.

Where a differential signal is applied across positive input 603 and negative input 605, the input applied to positive input 603 is the same magnitude as negative input 605, but exactly one hundred and eighty degrees out of phase. If one now looks at the polarity of the signals applied to the two non-inverting input 614a and non-inverting input 624a (and by symmetry non-inverting input 614b and non-inverting input 624b) the overall transconductance for the respective operational amplifier 695 is Gm1+Gm2. This relative high transconductance (i.e., high compared to the transconductance applied to a common mode signal) does not result in instability as feedback resistors 630, 640 attenuate the signal from the output allowing a larger transconductance without becoming unstable.

Referring back to the earlier discussion of the prior art amplifiers, stability is increased where either the transconductance is reduced or the capacitance is increased. In the case of differential amplifier 600, the same level of transconductance may be achieved for differential signals, while offering a dramatically reduced transconductance for common mode signals. Hence, differential amplifier 600 provides for increased stability when presented with common mode signals, while maintaining the desired closed loop gain for differential signals. Said another way, differential amplifier 600 provides for increased stability without the detrimental bandwidth limitations discussed above in relation to the prior art.

As an example, differential amplifier 600 may be designed with an open loop gain of six with Gm1 being equal to three fifths (i.e., 3.6) of the overall Gm and Gm2 being equal to two fifths (i.e., 2.4) of the overall Gm. In this case where a common mode signal is applied, it will be amplified by a difference between Gm1 and Gm2, or 1.2, In contrast, where a differential signal is applied, it will be amplified by the sum of Gm1 and Gm2, or the closed loop gain of six.

In conclusion, the present invention provides novel systems, devices, methods for signal amplification. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus comprising:
   a plurality of amplifiers, wherein each amplifier includes:
      a plurality of input sets, wherein each input set is amplified by a transconductance to form an amplified signal; and
      a summation node, wherein the summation node aggregates at least two amplified signals to create an aggregate amplified signal; and
   a resistor that is coupled to an output of a first amplifier from the plurality of amplifiers to at least one input from the input set of the first amplifier and to at least one input from the input set of a second amplifier from the plurality of amplifiers such that an overall transconductance of the first and second amplifiers is the difference the transconductances of the first and second amplifiers to a common mode signal and the overall transconductance of the first and second amplifiers is the sum of the transconductances of the first and second amplifiers to differential signal.

2. The apparatus of claim 1, wherein each input set further comprises a non-inverting input and a inverting input.

3. The apparatus of claim 1, wherein the apparatus further comprises:
   an output stage that drives the aggregate amplified signal as an output.

4. The apparatus of claim 1, wherein the apparatus is configured such that each aggregate amplified signal is proportionately equal to the common mode input signal amplified by the difference between transconductances.

5. The apparatus of claim 1, wherein at least one of the input sets includes:
   a positive differential input signal applied to the base of a first NPN transistor;
   a negative differential input signal applied to the base of a second NPN transistor; and
   a bias circuit, wherein the emitter of the first NPN transistor and the emitter of the second NPN transistor are electrically coupled to the bias circuit, and wherein the bias circuit at least in part defines at least one of the transconductance.

6. The apparatus of claim 5, wherein the positive differential input signal is a first positive differential input signal, wherein the negative differential signal is a first negative differential signal, wherein the bias circuit is a first bias circuit, and wherein the second input set includes:
   a second positive differential input signal applied to the base of a third NPN transistor;
   a second negative differential input signal applied to the base of a fourth NPN transistor; and
   a second bias circuit, wherein the emitter of the third NPN transistor and the emitter of the fourth NPN transistor are electrically coupled to the second bias circuit, and wherein the second bias circuit at least in part defines at least one of the transconductances.

7. The apparatus of claim 1, wherein summation node comprises a group of transistors electrically coupled to sum outputs of at least two input sets.

8. A dual transconductance differential amplifier, the dual transconductance differential amplifier comprising:
   a first dual input operational amplifier, wherein the first dual input operational amplifier includes:
      a first input set, wherein the first input set is amplified by a first transconductance to form a first amplified signal;
      a second input set, wherein the second input set is amplified by a second transconductance to form a second amplified signal; and
      a first summation node, wherein the first summation node aggregates the first amplified signal with the second amplified signal to create a first aggregate amplified signal;
   a second dual input operational amplifier, wherein the second dual input operational amplifier includes:
      a third input set, wherein the third input set is amplified by the first transconductance to form a third amplified signal;
      a fourth input set, wherein the fourth input set is amplified by the second transconductance to form a fourth amplified signal; and
      a second summation node, wherein the second summation node aggregates the third amplified signal with the fourth amplified signal to create a second aggregate amplified signal;
   a first feedback resistor, wherein an output of the first dual input operational amplifier is electrically coupled to an inverting input of the first input set via the first feedback resistor and to a non-inverting input of the fourth input set via the first feedback resistor; and
   a second feedback resistor, wherein an output of the second dual input operational amplifier is electrically coupled to a non-inverting input of the second input set via the second feedback resistor and to an inverting input of the third input set via the second feedback resistor.

9. The dual transconductance differential amplifier of claim 8, wherein the dual transconductance differential amplifier further comprises:
   a positive differential input, wherein the positive differential input is electrically coupled to a non-inverting input of the first input set and to an inverting input of the fourth input set; and
   a negative differential input, wherein the negative differential input is electrically coupled to an inverting input of the second input set and to a non-inverting input of the third input set.

10. The dual transconductance differential amplifier of claim 8, wherein the dual transconductance differential amplifier further comprises:
    a third feedback resistor electrically coupled between the first feedback resistor and the second feedback resistor.

11. The dual transconductance differential amplifier of claim 8, wherein the first dual input operational amplifier further includes:
    an output stage, wherein an output of the first dual input operational amplifier is the first aggregate amplified signal driven by the output stage.

12. The dual transconductance differential amplifier of claim 8, wherein the second dual input operational amplifier further includes:
    an output stage, wherein an output of the second dual input operational amplifier is the second aggregate amplified signal driven by the output stage.

13. The dual transconductance differential amplifier of claim 8, wherein the first dual input operational amplifier is configured such that the first aggregate amplified signal is proportionately equal to the common mode input signal amplified by the difference between the first transconductance and the second transconductance.

14. The dual transconductance differential amplifier of claim 13, wherein the second dual input operational amplifier is configured such that the second aggregate amplified signal is proportionately equal to the common mode input signal amplified by the difference between the first transconductance and the second transconductance.

15. The dual transconductance differential amplifier of claim 8, wherein the first input set includes:

a positive differential input signal applied to the base of a first NPN transistor; a negative differential input signal applied to the base of a second NPN transistor; and a bias circuit, wherein the emitter of the first NPN transistor and the emitter of the second NPN transistor are electrically coupled to the bias circuit, and wherein the bias circuit at least in part defines the first transconductance.

16. The dual transconductance differential amplifier of claim 15, wherein the positive differential input signal is a first positive differential input signal, wherein the negative differential signal is a first negative differential signal, wherein the bias circuit is a first bias circuit, and wherein the second input set includes:

a second positive differential input signal applied to the base of a third NPN transistor;

a second negative differential input signal applied to the base of a fourth NPN transistor; and a second bias circuit, wherein the emitter of the third NPN transistor and the emitter of the fourth NPN transistor are electrically coupled to the second bias circuit, and wherein the second bias circuit at least in part defines the second transconductance.

17. The dual transconductance differential amplifier of claim 16, wherein the first summation node comprises:

a group of transistors electrically coupled to sum a first output of the first input set and with a second output of the second input set.

18. A dual transconductance differential amplifier, the dual transconductance differential amplifier comprising:

a first dual input operational amplifier, wherein the first dual input operational amplifier includes:
 a first input set, wherein the first input set includes a first non-inverting input and a first inverting input, and wherein the first input set is amplified by a first transconductance to form a first amplified signal;
 a second input set, wherein the second input set includes a second non-inverting input and a second inverting input, and wherein the second input set is amplified by a second transconductance to form a second amplified signal; and
 a first summation node, wherein the first summation node aggregates the first amplified signal with the second amplified signal to create a first aggregate amplified signal;

a second dual input operational amplifier, wherein the second dual input amplifier includes:
 a third input set, wherein the third input set includes a third non-inverting input and a third inverting input, wherein the third input set is amplified by the first transconductance to form a third amplified signal;
 a fourth input set, wherein the fourth input set includes a fourth non-inverting input and a fourth inverting input, wherein the fourth input set is amplified by the second transconductance to form a fourth amplified signal; and
 a second summation node, wherein the second summation node aggregates the third amplified signal with the fourth amplified signal to create a second aggregate amplified signal;

a positive differential input, wherein the positive differential input is electrically coupled to a non-inverting input of the first input set and to an inverting input of the fourth input set;

a negative differential input, wherein the negative differential input is electrically coupled to an inverting input of the second input set and to a non-inverting input of the third input set;

a first feedback resistor, wherein an output of the first dual input operational amplifier is electrically coupled to an inverting input of the first input set via the first feedback resistor and to a non-inverting input of the fourth input set via the first feedback resistor; and a second feedback resistor, wherein an output of the second dual input operational amplifier is electrically coupled to a non-inverting input of the second input set via the second feedback resistor and to an inverting input of the third input set via the second feedback resistor.

19. The dual transconductance differential amplifier of claim 18, wherein the dual transconductance amplifier is configured such that to a differential signal, the overall transconductance is the sum of the first transconductance and the second transconductance.

20. An apparatus comprising:

a plurality of amplifiers, wherein each amplifier includes:
 a plurality of input sets, wherein each input set is amplified by a transconductance to form an amplified signal; and
 a summation node, wherein the summation node aggregates at least two amplified signals to create an aggregate amplified signal;

a resistor network that is coupled to an output of an amplifier from the plurality of amplifiers and to at least one input from the input set of another amplifier from the plurality of amplifiers, wherein an overall transconductance to a common mode signal of the amplifiers coupled to the resistor network is the difference between the transconductances of the amplifiers coupled to the resistor network, and wherein the overall transconductance to a differential signal of the amplifiers coupled to the resistor network is the sum of the transconductances of the amplifiers coupled to the resistor network; and an output stage, wherein an output of at least one of the amplifiers is its aggregate amplified signal driven by the output stage.

21. The apparatus of claim 20, wherein the output stage further comprises a plurality of output stages, wherein an output of each amplifier is its aggregate amplified signal driven by at least one of the output stages.

22. The apparatus of claim 1, wherein at least one of the input sets includes:

a positive differential input signal applied to the base of a first NPN transistor;

a negative differential input signal applied to the base of a second NPN transistor; and a bias circuit, wherein the emitter of the first NPN transistor and the emitter of the second NPN transistor are electrically coupled to the bias circuit, and wherein the bias circuit at least in part defines the first transconductance.

23. The apparatus of claim 22, wherein the positive differential input signal is a first positive differential input signal, wherein the negative differential signal is a first negative differential signal, wherein the bias circuit is a first bias circuit, and wherein the second input set includes:

a second positive differential input signal applied to the base of a third NPN transistor;

a second negative differential input signal applied to the base of a fourth NPN transistor; and a second bias circuit, wherein the emitter of the third NPN transistor and the emitter of the fourth NPN transistor are electrically coupled to the second bias circuit, and wherein the second bias circuit at least in part defines at least one of the transconductances.

24. The apparatus of claim 20, wherein each summation node comprises a group of transistors electrically coupled to sum outputs of at least two input sets.

* * * * *